(12) United States Patent
Jones et al.

(10) Patent No.: US 10,652,131 B2
(45) Date of Patent: May 12, 2020

(54) METHOD AND APPARATUS TO PROVIDE BOTH HIGH SPEED AND LOW SPEED SIGNALING FROM THE HIGH SPEED TRANSCEIVERS ON AN FIELD PROGRAMMABLE GATE ARRAY

(71) Applicant: ADVANTEST CORPORATION, Tokyo (JP)

(72) Inventors: Michael Jones, San Carlso, CA (US); Alan S. Krech, Fort Collions, CO (US); Eric Kushnick, Santa Clara, CA (US)

(73) Assignee: ADVANTEST CORPORATION, Tokyo (JP)

( * ) Notice: Subject to any disclaimer, the term of this patent is extended or adjusted under 35 U.S.C. 154(b) by 30 days.

(21) Appl. No.: 14/458,466

(22) Filed: Aug. 13, 2014

(65) Prior Publication Data
US 2016/0036684 A1 Feb. 4, 2016

Related U.S. Application Data

(60) Provisional application No. 61/926,667, filed on Jan. 13, 2014, provisional application No. 61/952,472, filed on Mar. 13, 2014, provisional application No. 61/907,659, filed on Nov. 22, 2013.

(51) Int. Cl.
| | |
|---|---|
| *H04L 12/26* | (2006.01) |
| *H04B 14/02* | (2006.01) |
| *H03K 5/1534* | (2006.01) |
| *H03K 19/17728* | (2020.01) |

(52) U.S. Cl.
CPC ........... *H04L 43/50* (2013.01); *H03K 5/1534* (2013.01); *H03K 19/17728* (2013.01); *H04B 14/026* (2013.01)

(58) Field of Classification Search
None
See application file for complete search history.

(56) References Cited

U.S. PATENT DOCUMENTS

| 7,426,252 B1* | 9/2008 | Chuang ................. H04L 7/0338 375/219 |
|---|---|---|
| 7,760,119 B2* | 7/2010 | Ohtaka ................. G06F 1/0321 327/106 |
| 2006/0088060 A1* | 4/2006 | Fujikami ............... H04L 1/0041 370/474 |
| 2008/0010568 A1* | 1/2008 | Kushnick ............ H04L 12/2697 714/724 |
| 2010/0321127 A1* | 12/2010 | Watanabe ........ G01R 31/31924 332/149 |

(Continued)

Primary Examiner — Peter Chen
Assistant Examiner — Jeff Banthrongsack

(57) ABSTRACT

A programmable logic device, such as a field programmable gate array (FPGA), is disclosed that allows for both high speed and low speed signal processing using the existing high speed transceiver. The programmable logic of the device may be programmed to include a sampling logic block that determines the low speed bit patterns from a device under test (DUT). The logic may further include a bit replication logic block that replicates bits such that the output of the device's high speed transceiver looks like a low speed signal to the DUT. The device, therefore, can communicate with the DUT at both the high and low speeds without the need for intermediate hardware.

21 Claims, 10 Drawing Sheets

(56) References Cited

U.S. PATENT DOCUMENTS

2012/0245879 A1\* 9/2012 Mikkola ................. G06F 19/00
  702/117
2012/0262215 A1\* 10/2012 Suda ................ G01R 31/31922
  327/299

\* cited by examiner

METHOD AND APPARATUS TO PROVIDE BOTH HIGH SPEED AND LOW SPEED SIGNALING FROM THE HIGH SPEED TRANSCEIVERS ON AN FIELD PROGRAMMABLE GATE ARRAY

CLAIM OF PRIORITY

The present application claims priority as a non-provisional of Ser. No. 61/907,659 filed on Nov. 22, 2013, as non-provisional of Ser. No. 61/926,667 filed on Jan. 13, 2014 and as non-provisional of Ser. No. 61/952,472 filed on Mar. 13, 2014, all of which are herein incorporated by reference in their entirety.

TECHNICAL FIELD

The present invention relates to programmable logic devices, such as field programmable gate arrays ("FPGA"), and a method of programming the device so as to allow the device's high speed transceiver to communicate with a device under test both in high and low speed.

BACKGROUND

There are several protocol standards that specify the signaling mechanism that uses both a combination of a high speed signaling (usually greater than one gigabit per second "Gbps") and a low speed signaling (usually as low as 3 megabits per second "Mbps"). Currently, a field programmable gate array ("FPGA") may be used to talk to devices that have this protocol. Because a FPGA is reprogrammable, a single FPGA can be used to test different devices. For example, in one test the FPGA may be connected to a Universal Serial Bus ("USB') device, a PCI Express device, or a universal flash storage ("UFS") device. In UFS devices, the high speed signal is approximately 1.25, 2.5 or 5 Gbps. There is also a separate low speed signal in the range of 3 Mbps to several hundred megabits per second, but commonly it is between 10 and 100 Mbps.

It would be advantageous to communicate both signals through the high speed serial output of the FPGA—i.e., at 1.25, 2.5 or 5 Gbps and at 3 Mbps to hundreds of Mbps. However, the FPGA high speed transceiver that connects at those high speeds generally does not effectively communicate at the low signal speeds needed. The minimum speed of the FPGA high speed transceiver is somewhere on the order of 600 or 700 Mbps, far in excess of the low speed signal.

To address accessing the both the high and low speed signals, current testing uses an analog board between the device under test ("DUT") and the FPGA. Shown in FIG. 1 is a currently used set-up 100 with an analog board 105 used to communicate with the DUT 110 using low signal speed signaling 115. When the setup 100 is in low speed mode the switches 120,125 are set to the low speed signaling at the DUT 110 and the low speed components 130 of the board 105. The components 130 may include analog switches, drivers, comparators and digital-analog converters. The components 130 are connected to the FPGA 135 via input/output lines 140. The lines 140 illustrated may represent multiple input/output lines. This switch configuration allows low speed signals to travel from the DUT 110 through the board 105 to the FPGA 135, and those signals are then processed by the protocol logic 145 allowing the CPU testing resources 150 to communicate with the DUT 110 using low speed signaling.

When the setup 100 is configured for high speed signaling the switches 120,125 are set to connect the high speed signaling 155 to be in connection with the high speed serial transceiver 160. Because the high speed signaling is within the bandwidth of the transceiver 160, the board 105 components 130 are not necessary and therefore are bypassed. The transceiver 160 is connected to the protocol logic 145, which is then connected to the CPU testing resources 150. This configuration allows the CPU testing resources 150 to communicate with the DUT 110 using high speed signaling.

The FPGA 135 is programmed such that the output of the FPGA 135 switches the analog board 105 via switches 120, 125 at the appropriate times between the high speed signaling and the low speed signaling. To provide the appropriate timing signals, several additional connections 160 to the FPGA 135 are needed that may not be readily available.

Setup 100 however, has several additional shortcomings. Manufacturing and maintaining a current inventory of needed analog boards is expensive. Not only is the manufacturing expensive, but the board may require several input/output connections to the FPGA that may not be readily available. So the testing equipment, including the FGPA would need to be physically reconfigured to accommodate a particular board. And the equipment would then need to be reconfigured again to change the board to enable testing of another DUT.

What is therefore needed is a solution that overcomes these deficiencies and allows connection to a DUT's high and low speed signaling so that testing can be done efficiently, and inexpensively. Additionally, the solution should allow for quick and easy modification of the testing equipment to accommodate various DUTs.

SUMMARY

A programmable logic device is disclosed that allows for both high speed and low speed signal processing using the existing high speed transceiver. The device may be a field programmable gate array (FPGA). The programmable logic of the device may be programmed to include a sampling logic block that determines the low speed bit patterns from a device under test (DUT). The logic may further include a bit replication logic block that replicates bits such that the output of the high speed transceiver looks like, for example, a pulse-width modulated (PWM) signal, a non-return to zero inverted (NRZI) signal or a non-return to zero (NRZ) signal to the DUT. The device, therefore, can communicate with the DUT at both the high and low speeds without the need for intermediate hardware.

Specifically, the device includes a high speed transceiver adapted to receive a first low speed signal from a DUT; and a programmable logic block connected to the high speed transceiver. The logic block includes a protocol logic block and a sampling logic block. The sampling block (a) receives a transceiver sample pattern from the high speed transceiver based on the first low speed signal from the DUT; (b) detects/determines each frame of the low speed signal; and (c) determines for each frame whether the low speed signal encodes a one or a zero and passes that data to the protocol logic block.

The programmable logic block of the device may also include a bit replication logic block that (aa) receives a protocol logic bit pattern (i.e., an input bit pattern) from the protocol logic block that includes a plurality of bits; (bb) determines an appropriate bit replication multiplier; (cc) for each bit in the protocol logic bit pattern, creates a bit replication pattern comprising a series of bits equal to the bit replication multiplier and encodes the protocol logic bit pattern; and (dd) passes the bit replication pattern to the high speed transceiver.

A system including the FPGA is also disclosed, as is the method used by both the sampling logic block and the bit replication block.

Other aspects of the invention are disclosed herein as discussed in the following Drawings and Detailed Description.

BRIEF DESCRIPTION OF THE DRAWINGS

The invention can be better understood with reference to the following figures. The components within the figures are not necessarily to scale, emphasis instead being placed on clearly illustrating example aspects of the invention. In the figures, like reference numerals designate corresponding parts throughout the different views and/or embodiments. It will be understood that certain components and details may not appear in the figures to assist in more clearly describing the invention.

DETAILED DESCRIPTION OF EXAMPLE EMBODIMENTS

The following is a non-limiting written description of example embodiments illustrating various aspects of the invention. These examples are provided to enable a person of ordinary skill in the art to practice the full scope of the invention without having to engage in an undue amount of experimentation. As will be apparent to persons skilled in the art, further modifications and adaptations can be made without departing from the spirit and scope of the invention, which is limited only by the claims.

Provided herein is a solution that overcome the deficiencies of the prior art and allows connection to a DUT's high and low speed signaling, through the programmable logic device's high speed transceiver so that testing can be done efficiently and inexpensively. Additionally, the disclosed solution allows for quick and easy modification of the testing equipment to accommodate various DUTs.

Figure 1:
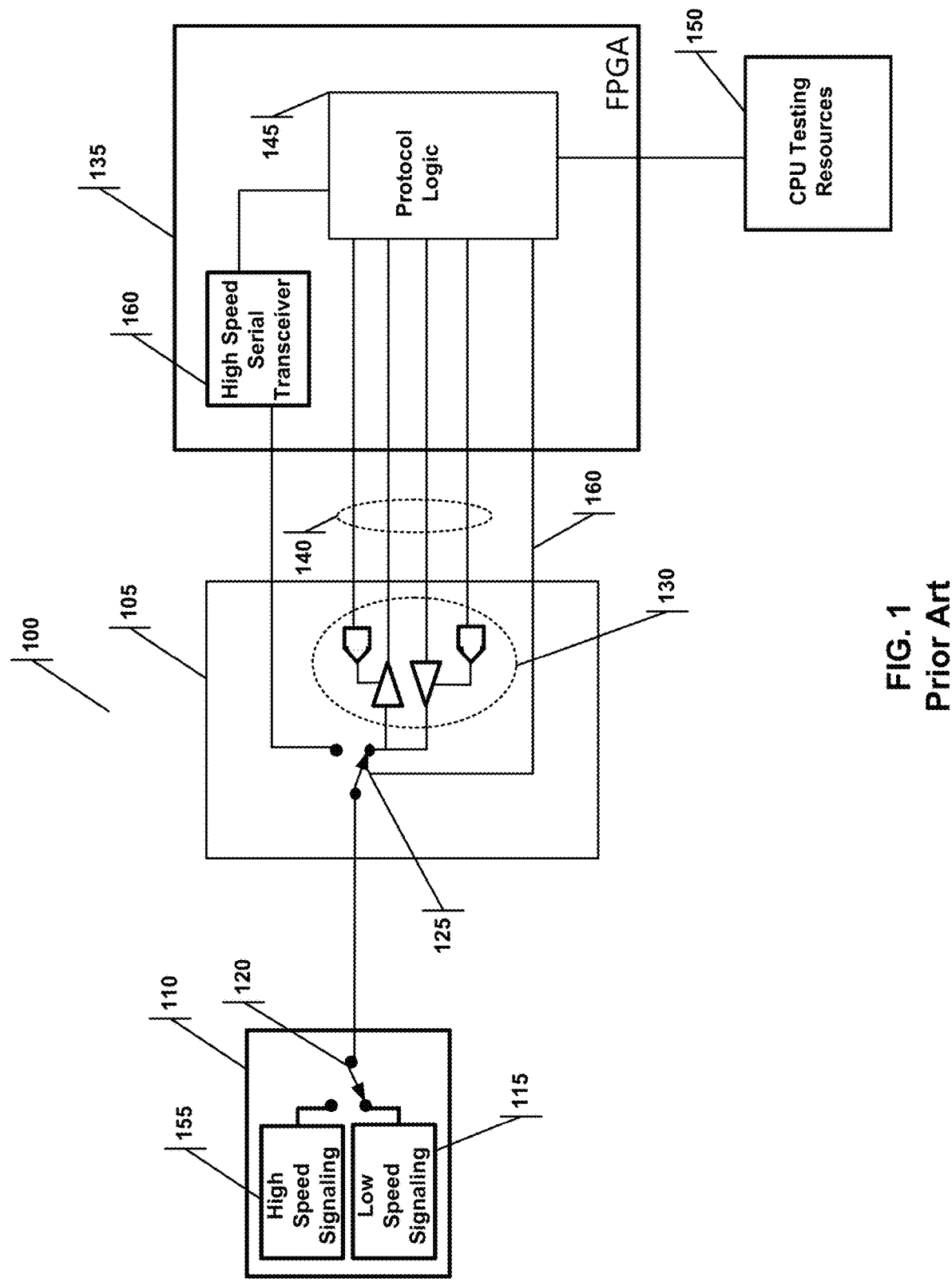
FIG. 1 is a schematic of a prior art system for testing a device under test with both the high speed and low speed signaling on the same signal line.
Figure 2:
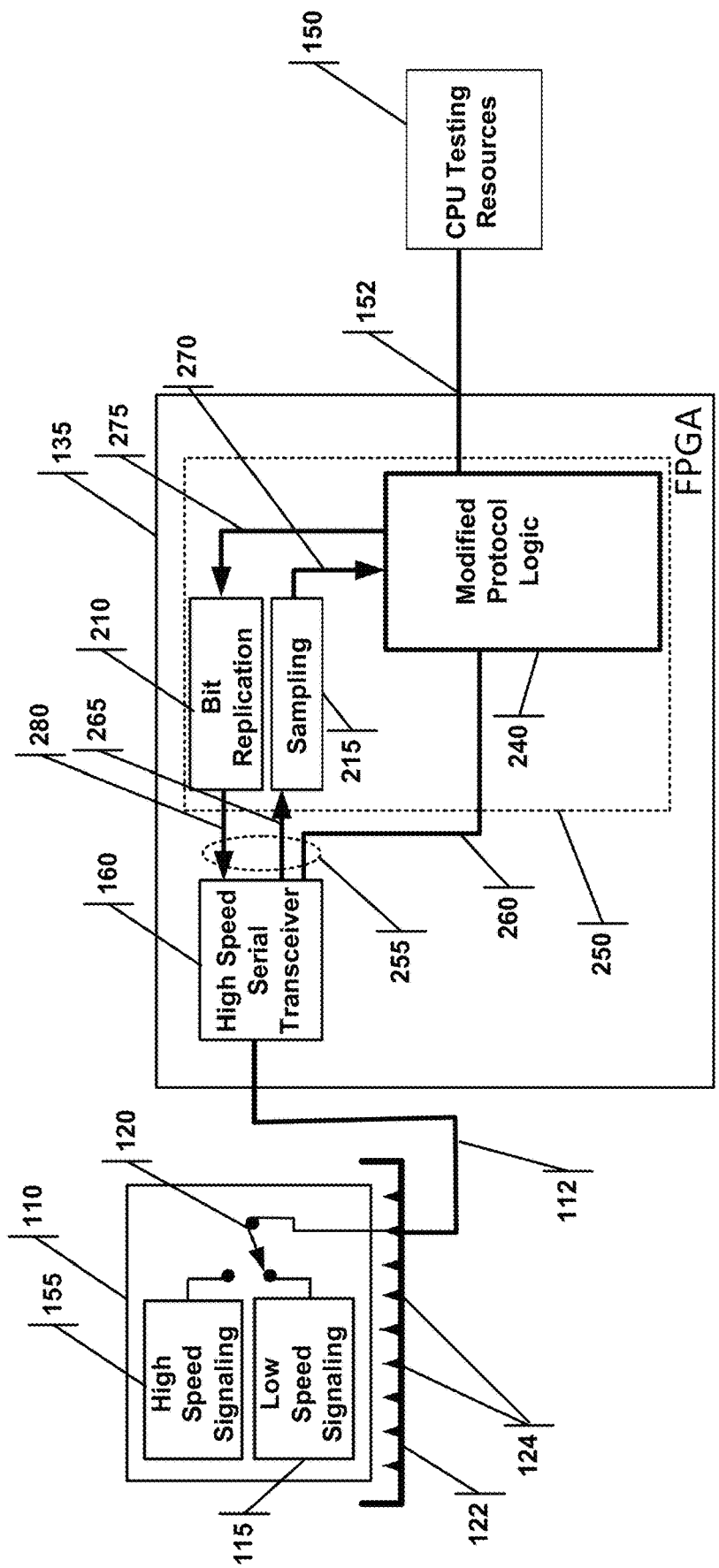
FIG. 2 is a schematic of a novel programmable logic device for testing a device under test with both high speed and low speed signaling.

The basic configuration of the system is shown in FIG. 2. The programmable logic device (which may be a FPGA 135) contains the high speed serial transceiver 160. A bit replication logic block 210 is connected to the input of the high speed transceiver 160 via line 280, and a sampling logic block 215 is connected to the output of the high speed transceiver 160 via line 265. The high speed transceiver 160 is connected to the DUT 110 via line 112, using either high speed signaling 155 or low speed signaling 115, as determined by the position of switch 120. The DUT is connected to the system through a caddy 122, that has several pins/pads 124 that make physical contact with the DUT. The bit replication logic block 210 and the sampling logic block 215 are connected to the modified protocol logic 240 via lines 275 and 270, respectively. The FPGA 135 is connected to a CPU testing resource 150, through a communications port 152, allowing the testing resource 150 to communicate with the DUT 110 with both high speed signals and low speed signals. The modified protocol logic 240, the bit replication logic block 210 and the sampling logic block 215 are illustrated as distinct blocks, but each of these logic blocks may be encapsulated in a single logic block 250. Accordingly, the signal lines 255 shown as three distinct lines (260, 265,280) may simply be a signal line routed to the logic block 250, wherein the logic block can then determine whether or not to perform bit replication or sampling as discussed below.

When the system is set to low speed signaling, the switch 120 is connected to the low speed signaling 115 of the DUT 110. Those low speed signals are passed through to the high speed transceiver 160 and then to the sampling logic block 215 via line 265. The sampling logic block 215 processes the low speed signal (as discussed below with reference to FIGS. 3 and 4) and passes the processed signal to the modified protocol logic block 240 via line 270 and then to the CPU testing resource 150. When the CPU testing resource 150 communicates to the DUT 110 with the low speed signals, the modified protocol logic block 240 receives the signal from the CPU testing resource 150 and sends the signal to the bit replication logic block 210 via line 275. The bit replication logic block 210 processes the low speed signal (as discussed below with reference to FIGS. 5 and 6) and passes the processed signal to the high speed transceiver 160 via line 280 and then to the DUT 110.

When the system is set to high speed signaling, the switch 120 is connected to the high speed signaling 155 of the DUT 110. Those high speed signals are passed through to the high speed transceiver 160 and then to the modified protocol logic 240 via line 260. This configuration allows the CPU testing resources 150 to communicate with the DUT 110 using high speed signaling. In this switch configuration the sampling logic block 215 and the bit replication block 210 are bypassed.

Figure 3:
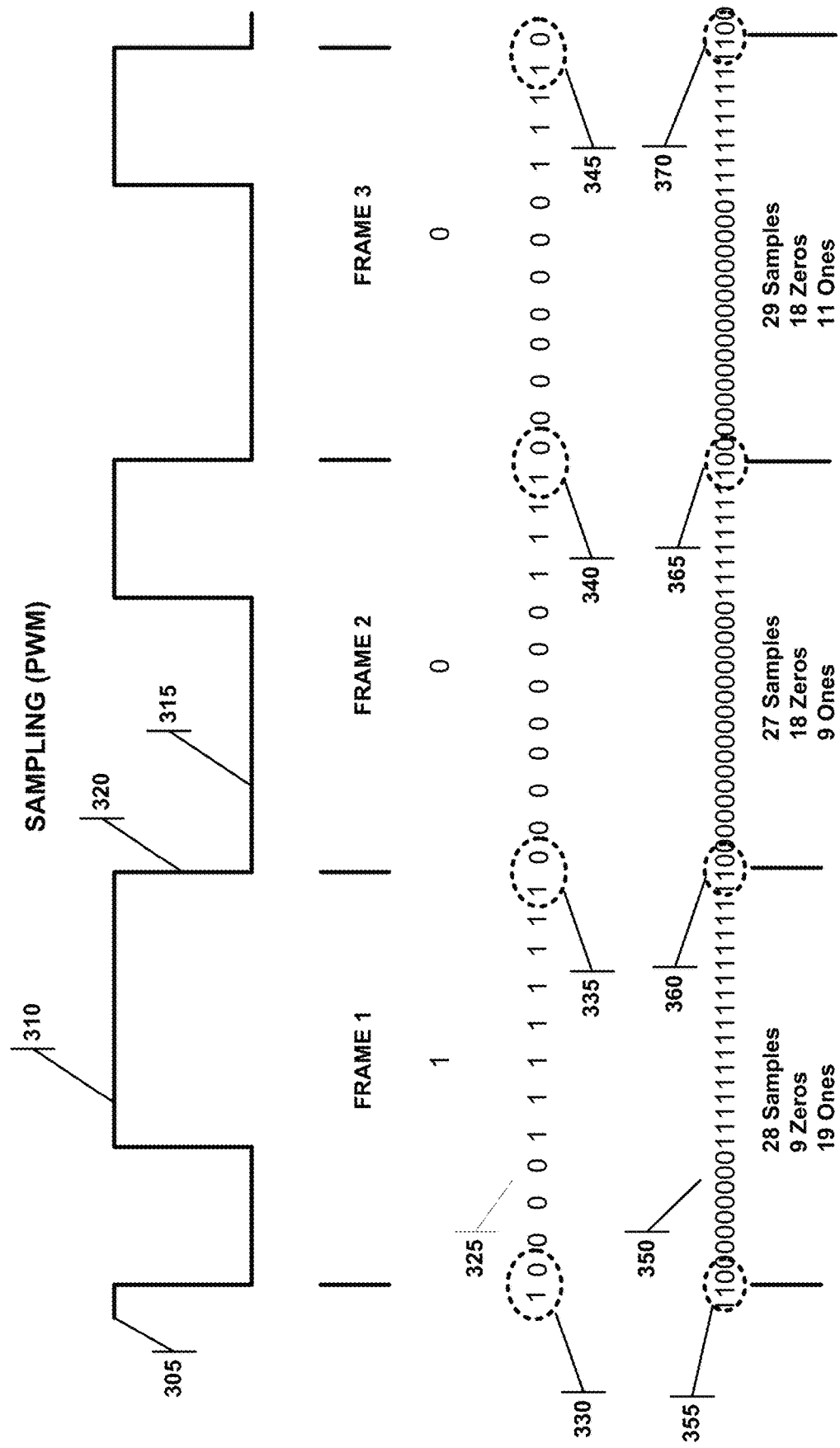
FIG. 3 illustrates the sampling logic block used for a pulsed-width modulation (PWM) signal of the novel programmable logic device for testing a device under test with both high speed and low speed signaling.

Turning to FIG. 3, the sampling logic block 215 will be discussed in more detail. The low speed signal from a DUT uses pulse-width modulation (PWM) to represent binary data. The low speed signal from the DUT, when viewed on an oscilloscope, would look like the pattern 305. The signal changes from a position of "1" at 310 to a position of "0" at 315. The transition from "1" to "0" at 320 defines the falling edge of a frame, wherein each frame represents a bit of either "1" or "0". So signal 305 illustrates three complete frames, and therefore encodes three bits. Whether the bit is a "1" or a "0" depends which position the signal is in more often in the frame. In frame 1, the signal is in the "1" position approximately twice as long as the "0" position, so this frame represents the bit of "1". In frames 2 and 3, the signal is in the "0" position approximately twice as long as the "1" position, so these frames represent the bit of "0".

Pushing the low speed PWM signal through the high speed transceiver would sample the signal depending on the high speed transceiver's current frame rate. If, for example, the original low speed signal is at 100 Mbps and the high speed transceiver is set at 1.2 Gbps, then for each bit encoded on the low speed signal, the high speed transceiver would sample 12 times. This is shown at high speed transceiver sample pattern 325, which represents 38 samples, even though the actual low speed signal was only three bits (note: there are two extra samples, one at the beginning and one at the end to illustrate the fall edge transitions, but only 36 samples encode the three original bits of the low speed PWM signal). Those 38 samples would be determined by taking the current position of the signal at the particular point in time when the sample was taken. Thus, the high speed transceiver sample pattern 325 starts a "1" then changes to "0" for the next four samples, then to "1" for the next eight samples, then to "0" for eight samples, then to "1" for four samples, and so on.

The sampling logic block is programmed to detect a falling edge at positions 330, 335, 340, 345. These edges define the frame. The sampling logic block then processes the samples within the falling edges to determine which position—i.e., "1" or "0"—is more dominant. Since frame 1 between position 330 and 335 has four zeros and eight ones, that frame encodes for a "1", and the sampling logic block would then pass a "1" to the modified protocol logic block. Frame 2, between position 335 and 340 contains eight zeros and four ones, and therefore encodes for a "0", as does frame 3 between positions 340 and 345. Other methods to determine if the frame is a "1" or a "0" may also be used. For example, the method may just look at the middle bit of the frame to determine whether the frame encodes for a "1" or a "0".

The example illustrated above is a bit simplistic because the high speed transceiver is sampling the low speed PWM at an exact multiple of twelve of the low speed signal rate. So each frame has precisely the same number of samples. In practice however, it may not be possible to know the low speed signal rate, and that rate may not be constant; therefore not only could the number of samples within a frame vary, but even between adjacent frames within the same signal, the number of samples could vary.

The method described herein does not need to know the rate of the low speed signal, but rather can use the internal clock of the FPGA and efficiently sample the low speed signal. Consider the high speed transceiver sample pattern 350 consisting of 86 samples. The high speed transceiver is set at a speed that is approximately 28 times that of the low speed signal rate. Again, the sampling logic block is programmed to detect a falling edge at positions 355, 360, 365, 370. The number of samples in each of the frames, however, is not constantly 28. For example, in frame 1 there are 28 samples, frame 2 has 27 samples and frame 3 has 29 samples.

The sampling logic block is programmed such that it can determine the dominant position within each frame, even though the dominance of the position may vary from frame to frame (because the sample rate and signal rate are not precisely linked). In frame 1 the dominant position is "1" with an occurrence of 67.8%, in frame 2 it is "0" with an occurrence of 66.6% and in frame 3 it is "0" with an occurrence of 62.1%. The sampling logic block may include a level of confidence or percentage, such that any occurrence above that percentage is determine to be the dominant position and therefore the bit to be encoded by that frame.

Figure 4:
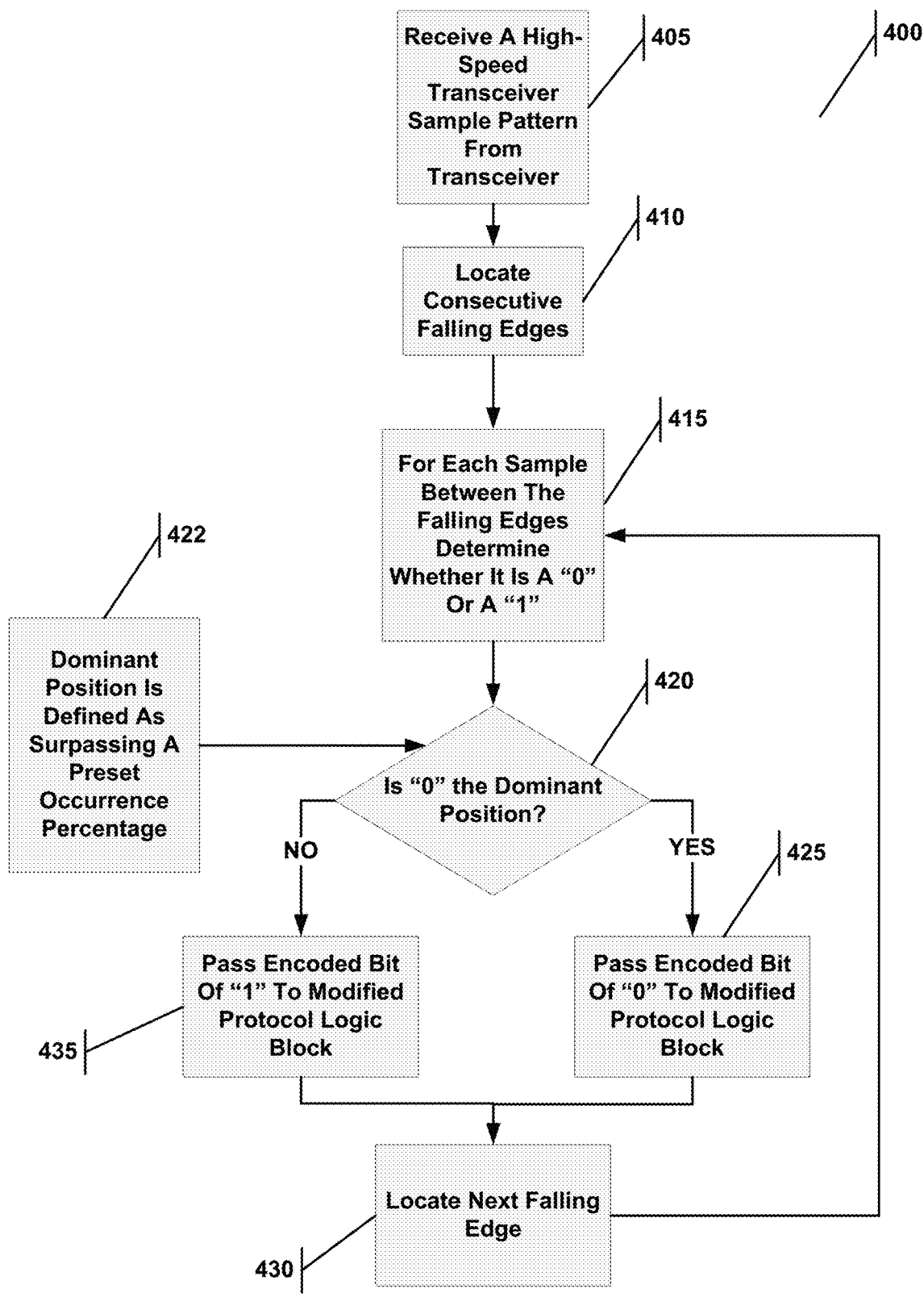
FIG. 4 illustrates a method employed by the sampling logic block used for a PWM signal of the novel programmable logic device for testing a device under test with both high speed and low speed signaling.

FIG. 4 illustrates the method 400 employed by the sampling logic block. At step 405 the sampling logic block receives the high speed transceiver sample pattern from the high speed transceiver, and locates a set of consecutive falling edges in step 410. For the samples between the falling edge set, the position of "0" or "1" should be determined at step 415. The method then determines whether the "0" is the dominant position in step 420. Optionally, a dominant position may be defined as surpassing a pre-set occurrence percentage as shown in block 422. If "0" is indeed the dominant position then the sampling logic block encodes and passes a bit of "0" to the modified protocol logic block in step 425. Then the method detects the next falling edge at step 430 and continues to step 415. If "0" is not the dominant position then the sampling logic block encodes and passes a bit of "1" to the modified protocol logic block in step 435. Then the method detects the next falling edge at step 430 and continues to step 415.

It should be noted that at step 420, only the dominance of the "0" position was determined. This is simply a design selection as it would be apparent that the dominance of the "1" position could have been substituted. Also, in the design as illustrated in FIG. 4, a bit of "1" is the default bit. So, for example, if the high speed transceiver sample pattern had a "0" occurrence of 55%, but the preset dominance percentage in block 422 were 60%, then the method would nevertheless pass a "1" at step 435. It is possible that within a frame there is not an overwhelming dominance, but in a binary system a "1" or "0" must be passed for the frame. Setting the preset dominance percentage of block 422 to 50% would simple pass the majority sample position as the bit.

Another technique would be to look at the value of the middle bit of the frame. Although this technique is straightforward it is more susceptible to make an erroneous decision due to noise or a single bit error than the technique described above.

Figure 5:
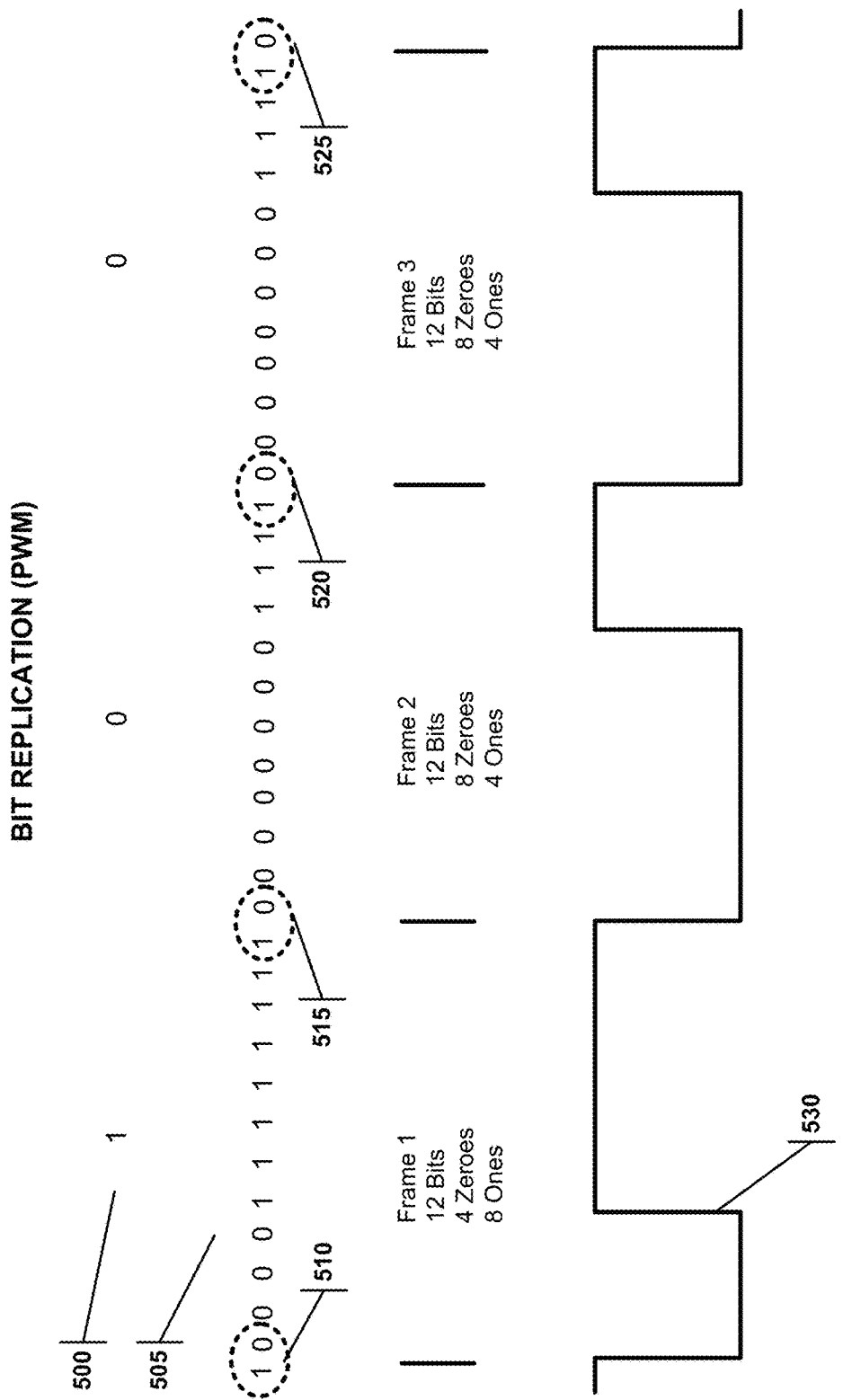
FIG. 5 illustrates the bit replication logic block used for a PWM signal of the novel programmable logic device for testing a device under test with both high speed and low speed signaling.

Turning to FIG. 5, the bit replication logic block is explained in detail. The modified protocol logic block passes a protocol logic bit pattern (i.e., an bit input pattern) to the bit replication logic block as shown in protocol logic bit pattern 500 consisting of "1", "0", "0". The bit replication logic block can then replicate the bits such that they can be passed through the high speed transceiver and seen by the DUT as a low speed PWM signal. The bit replication logic block can replicate the bit at a rate that it knows the DUT can detect. In this regard, the synchronization of the bit patterns is not as critical as it was in the sampling logic previously discussed. Since the low speed signal for a DUT is known to be in the range of 3 Mbps to several hundred megabits per second, but commonly between 10 and 100 Mbps, the system can set its high speed transceiver at a higher rate and then replicate the bits such that the DUT will "see" a PWM signal at the lower rate. For example, if the high speed transceiver is set by the FPGA at 1.2 GPS and the desired signal rate to the DUT is 100 MPS, then the bit replication must be 12 to 1. Thus a bit replication multiplier of 12 is needed. The bit replication logic block may therefore create the bit replication pattern 505, which represents "1", "0", "0" with four falling edges 510, 515, 520, 525. Frame 1 consists of a series of twelve bits (an amount equal to the bit replication multiplier) four zeroes followed by eight ones. Frames 2 and 3 each consist of twelve bits—eight zeroes followed by four ones. The bit replication pattern 505 is passed to the high speed transceiver and the output from the high speed transceiver looks like PWM signal 530, which can be read by the DUT.

Optionally, the bit replication logic block may look up the rate of the low speed signal as experienced by the sampling logic block and may set the high speed transceiver and the bit replication multiplier consistent with that rate.

Figure 6:
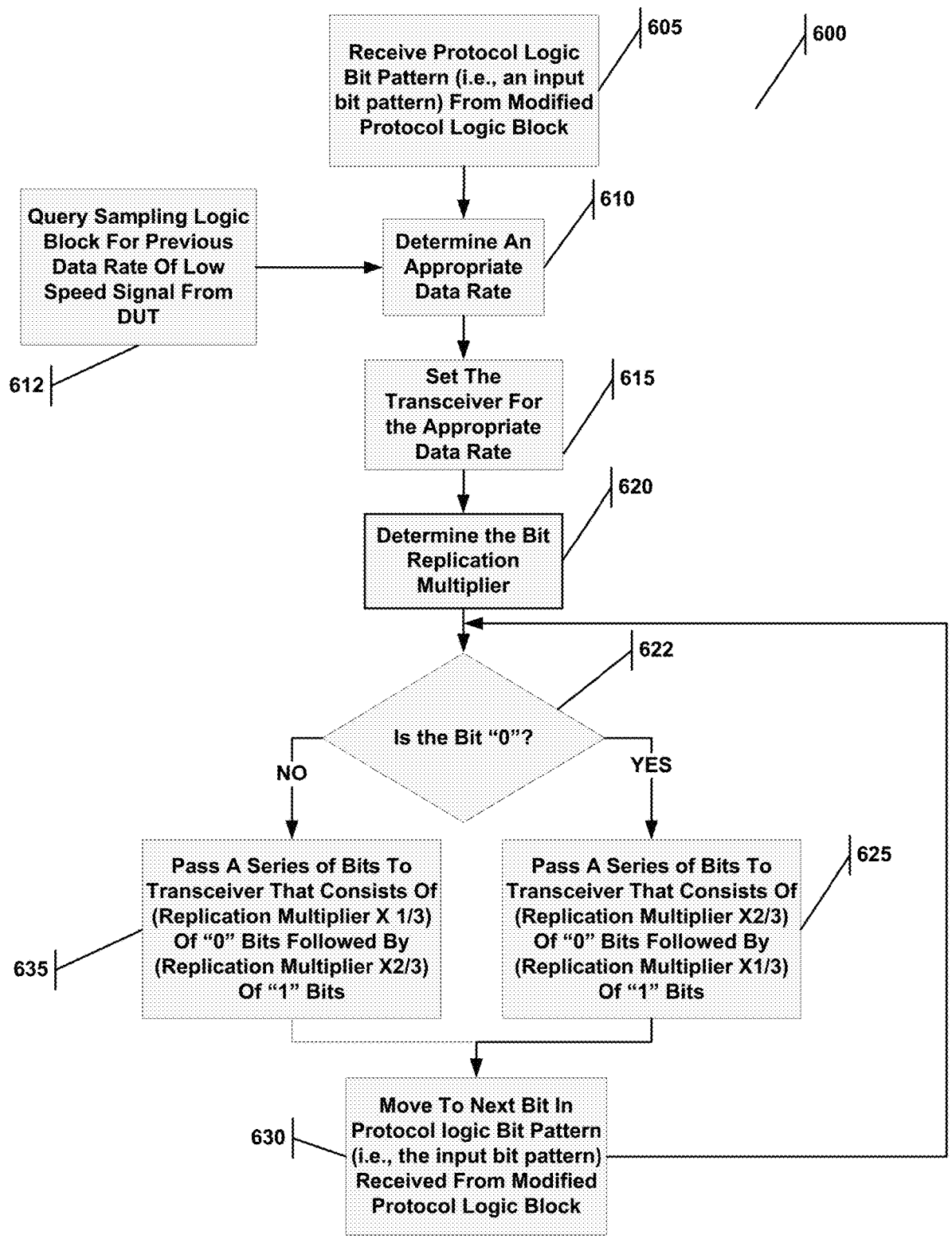
FIG. 6 illustrates a method employed by the bit replication logic block used for a PWM signal of the novel programmable logic device gate array for testing a device under test with both high speed and low speed signaling.

FIG. 6 illustrates the method 600 employed by the bit replication logic block. In step 605 a protocol logic bit pattern (i.e., an input bit pattern) is received from the modified protocol logic block. The method 600 then determines an appropriate data rate for the low speed signal to be transmitted to the DUT. It may do this by simply selecting a speed that falls within the known rate that the DUT can detect (step 610). Optionally, the system may query the sampling logic block regarding the previous data rate of the low speed signal from the DUT (block 612). The high speed transceiver is then set, as well as a bit replication multiplier selected, at steps 615 and 620 to realize the data rate determined in step 610. At this point, the method begins bit replication by examining the bits from the modified logic block at step 622. If the bit is a "0" then the method must encodes a series of bits which will look like a "0" PWM signal to the DUT. This is done by passing a bit replication pattern to the high speed transceiver that consists of (Replication Multiplier×⅔) of "0" bits followed by (Replication Multiplier×⅓) of "1" bits. So, for the example discussed above, the multiplier was 12, so a "0" is (12×⅔) zeros followed by (12×⅓) ones or 000000001111. The method then moves to the next bit in the protocol logic bit pattern (i.e., the input bit pattern) received from the modified logic block (step 630) and performs step 622.

If the bit is a "1" then at step 635 the method must encode a series of bits which will look like a "1" PWM signal to the DUT. This is done by passing a bit replication pattern to the high speed transceiver that consists of (Replication Multiplier×⅓) of "0" bits followed by (Replication Multiplier×⅔) of "1" bits. So, for the example discussed above, the multiplier was 12, so a "1" is (12×⅓) zeros followed by (12×⅔) ones or 000011111111.

Figure 7:
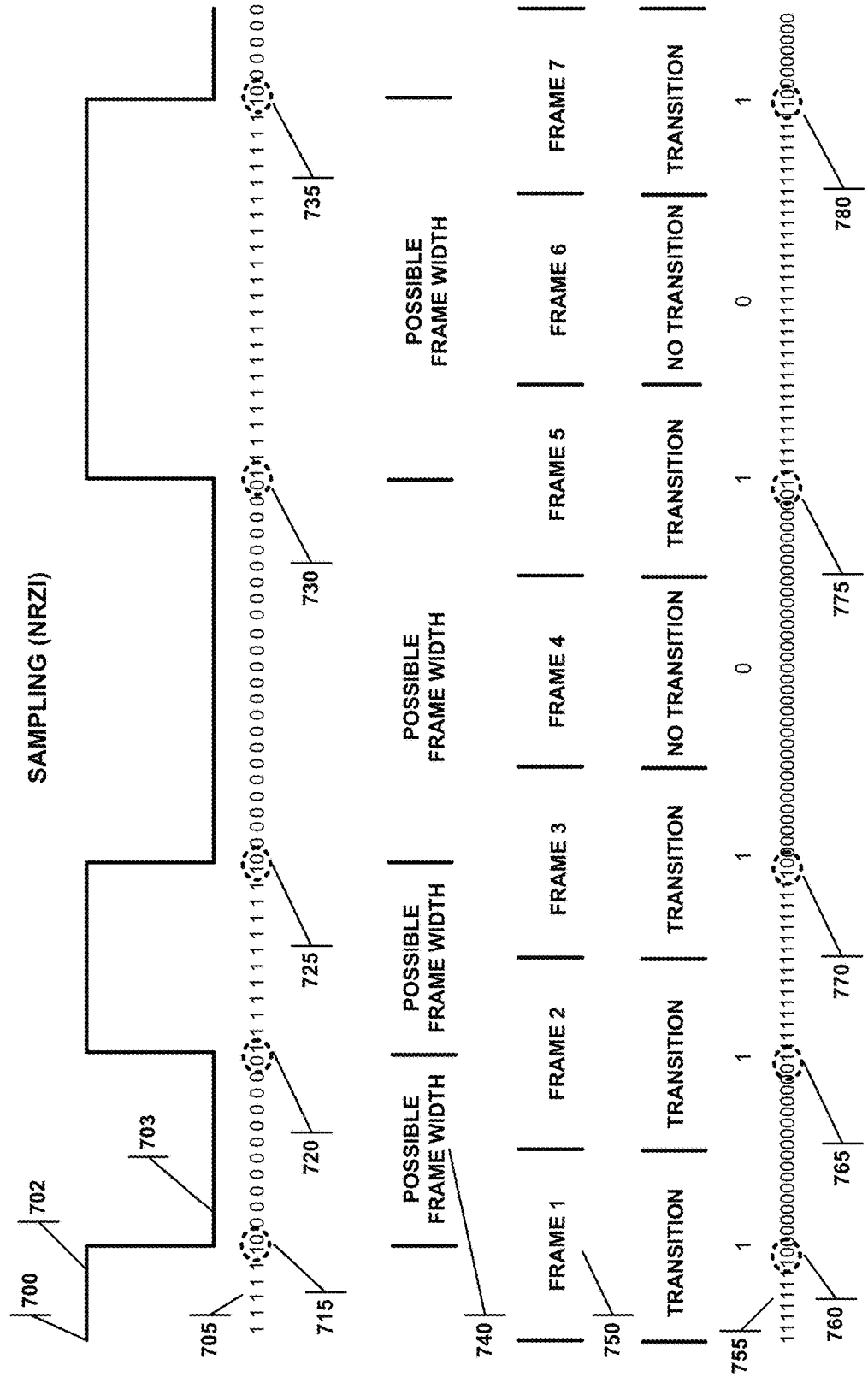
FIG. 7 illustrates the sampling logic block used for a non-return to zero inverted (NRZI) signal of the novel programmable logic device for testing a device under test with both high speed and low speed signaling.

Now turning to FIGS. 7, 8, 9 and 10 a method for sampling and replicating a non-return to zero inverted (NRZI) signal is disclosed. FIG. 7 illustrates the sampling logic block 215 in more detail, specifically for decoding a low speed NRZI signal from the DUT. The low speed signal from the DUT, when viewed on an oscilloscope, would look like the pattern 700.

If, for example, the original low speed signal is at 100 Mbps and the high speed transceiver is set at 1.2 Gbps, then for each bit encoded on the low speed signal, the high speed transceiver would sample 12 times. This is shown at high speed transceiver sample pattern 705, which represents 84 samples, even though the actual low speed signal was only 7 bits. Those 84 samples would be determined by taking the current position of the signal 700 at the particular point in time when the sample was taken. Thus, the high speed transceiver sample pattern 700 starts a "1" for six samples, then changes to "0" for the next twelve samples, then to "1" for the next twelve samples, then to "0" for twenty-four samples, then to "1" for twenty-four samples, and so on.

The signal changes from a position of "1" at 702 to a position of "0" at 703. The transition from "1" to "0" at 715 defines a transition, which under the NRZI scheme means a "1" bit. The signal 700 also changes from "0" to "1" at 720, another transition that encodes for a "1". The three remaining transitions 725, 730 and 735, also encode for a "1".

But the logic block must also look for non-transitions which encode for a "0" in the NRZI signal scheme. In order to detect non-transitions, the logic block must determine the frame size—i.e., the number of expected bits in a frame. It is clear that between two transitions there must be at least one frame. By looking at the number of bits between several transitions, the logic block can determine several possible frame widths 740. The shortest of these frame widths should ultimately yield the frame width of the NRZI signal. The logic block examines the NRZI signal for several transitions, buffers the signal, and once a frame size is determined, can go back to the buffered signal and decode it as descried below.

Once the system determines the shortest number of bits between adjacent transitions—here it is 12 bits—this defines the frame length. The start of the frame is then shifted by half the frame length as shown at 750 because under the NRZI signal scheme transitions occur mid frame. The logic block determines for each frame whether there is a transition or not at 755. When a transition is detected, such as at frames 1, 2, 3, 5 and 7, then this encodes for a "1", and when no transitions are found it encodes for a "0" as in frames 4 and 6.

The example illustrated above is a bit simplistic because the high speed transceiver is sampling the low speed NRZI at an exact multiple of twelve of the low speed signal rate. So each frame has precisely the same number of samples. In practice however, it may not be possible to know the low speed signal rate, and that rate may not be constant; therefore not only could the number of samples within a frame vary, but even between adjacent frames within the same signal, the number of samples could vary.

The method described herein does not need to know the rate of the low speed signal, but rather can use the internal clock of the FPGA and efficiently sample the low speed signal. Consider the high speed transceiver sample pattern 755 consisting of 123 samples. The high speed transceiver is set at a speed that is approximately 18 times that of the low speed signal rate. Again, the sampling logic block is programmed to detect the transitions at 760, 765, 770, 775, and 780. The number of samples in each of the frames, however, is not constantly 18. For example, in frame 1 there are 18 samples, frame 2 has 17 samples and frame 3 has 18 samples.

When determining the frame length, the logic block may find that shortest length is 17 bits, but sometimes it is 18 bits. If this occurs, the logic block may assign a frame length is 17 to every other frame, and 18 to the remaining frames. Alternatively, the logic block may determine the exact location of the transition within the frame and if it begins to drift to the frame edge, then the logic block may relocate the start of the frame so as to place the transitions (or non-transitions) in the middle of the frame.

Figure 8:
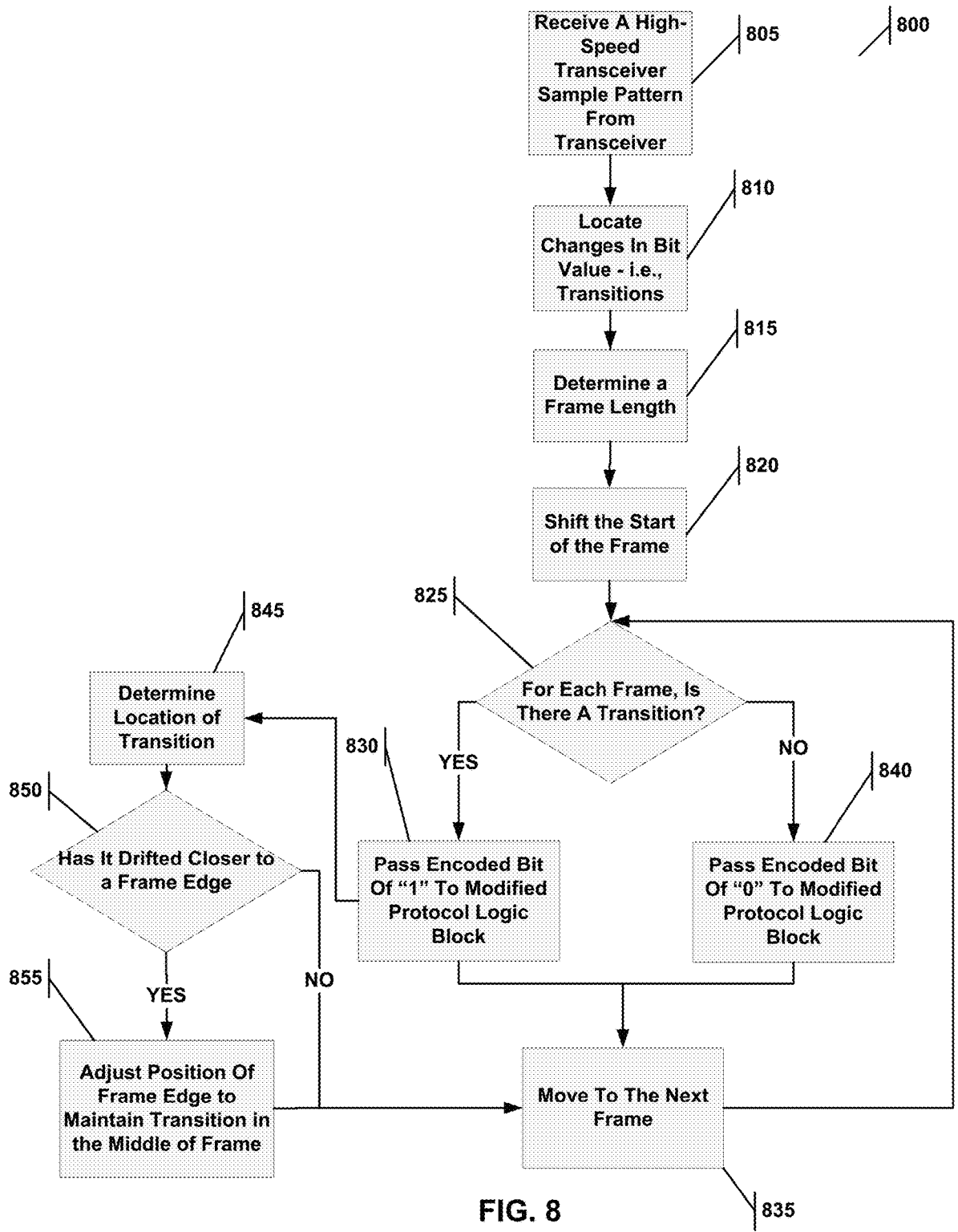
FIG. 8 illustrates a method employed by the sampling logic block used for a NRZI signal of the novel programmable logic device for testing a device under test with both high speed and low speed signaling.

FIG. 8 illustrates the method 800 employed by the sampling logic block. At step 805 the sampling logic block receives the high speed transceiver sample pattern from the high speed transceiver, and locates transitions in step 810. The method then determines the frame rate by selecting the shortest length of bits between adjacent transitions at step 815, and shifts the frame to maintain the transition within the middle of the frame (step 820).

For the samples between the frame edges, the presence of a transition should be determined at step 825. If there is a transition, then the sampling logic block encodes and passes a bit of "1" to the modified protocol logic block in step 830. Then the method moves to the next frame at step 835 and continues to step 825. If there is no transition, then the sampling logic block encodes and passes a bit of "0" to the modified protocol logic block in step 840. Then the method moves to the next frame at step 835 and continues to step 825.

Optionally, the method 800 may employ a check to prevent the transitions from drifting to the frame edge. This may be helpful because the sample rate of the method 800 may not be an exact multiple of the NRZI signal so the frame length would vary, and as a consequence the transition may drift to the frame edge and ultimately cause a decoding error. When the method detects a transition at step 830, it can then locate the exact location of the transition within the frame at step 845. If that location has drifted closer to a frame edge (step 850) then the method can adjust the position of the next frame edge to maintain the transition in the middle of the frame at step 855. If the transition has not moved closer to the frame edge, then no adjustment is necessary. The frame edge adjustment of step 855 does not need to occur every time the transition has drifted; rather the method may have a band within which the transition may occur without any adjustment to the frame edge. For example, if the frame length is 24 bits, then the transition may have a band of bit positions 10, 11, 12, 13, 14 where an adjustment would not occur, but once it is out of this band the frame edge is adjusted to re-center future transitions at bit position 12.

Figure 9:
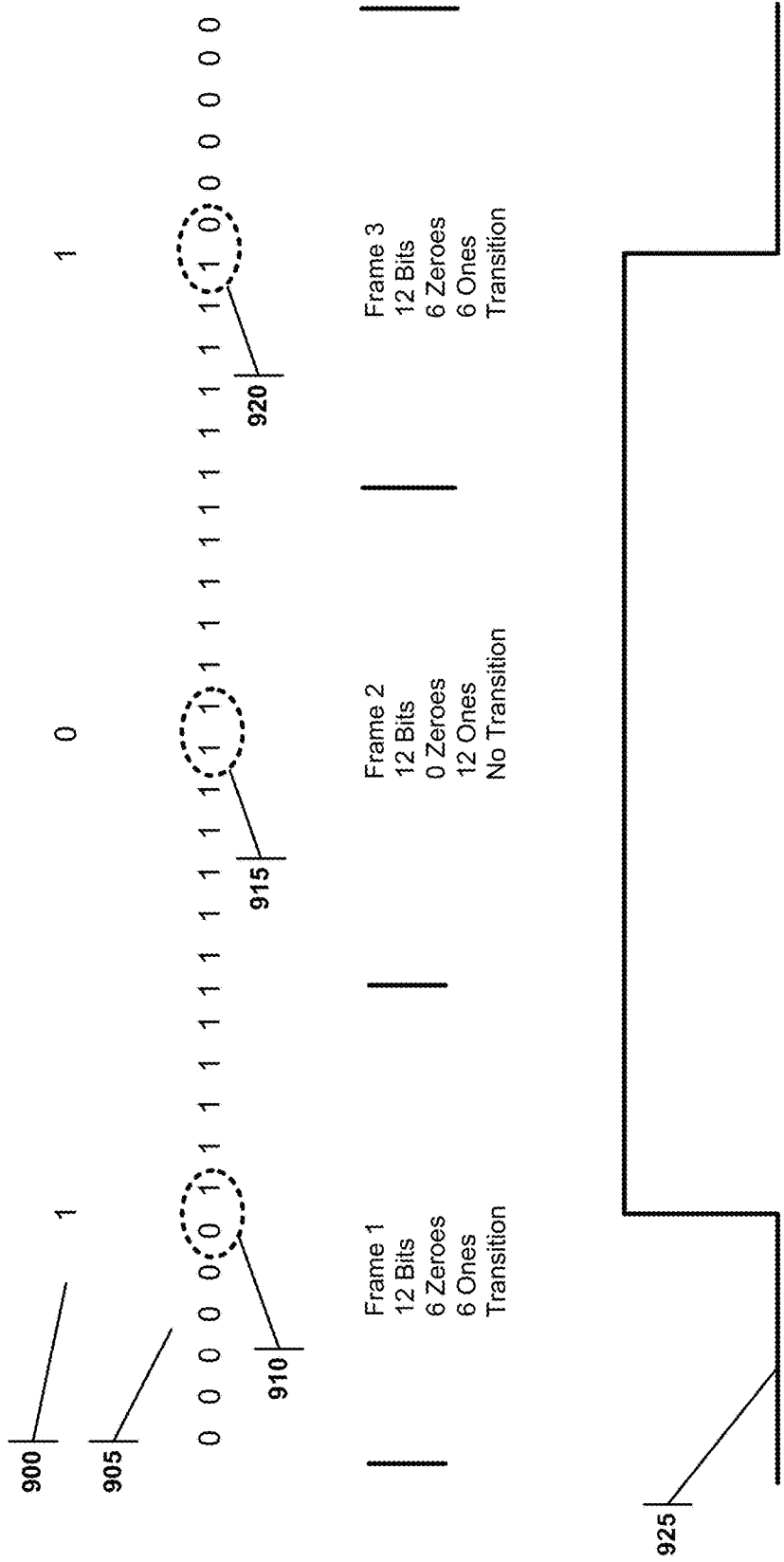
FIG. 9 illustrates the bit replication logic block used for a NRZI signal of the novel programmable logic device for testing a device under test with both high speed and low speed signaling.

Turning to FIG. 9, the bit replication logic block for the NRZI signal scheme is explained in detail. The modified protocol logic block passes a protocol logic bit pattern (i.e., an input bit pattern) to the bit replication logic block as shown in protocol logic bit pattern 900 consisting of "1", "0", "1". The bit replication logic block can then replicate the bits such that they can be passed through the high speed transceiver and seen by the DUT as a low speed NRZI signal. The bit replication logic block can replicate the bit at a rate that it knows the DUT can detect. In this regard, the synchronization of the bit patterns is not as critical as it was in the sampling logic previously discussed. Since the low speed signal for a DUT is known to be in the range of 3 Mbps to several hundred megabits per second, but commonly between 10 and 100 Mbps, the system can set its high speed transceiver at a higher rate and then replicate the bits such that the DUT will "see" a NRZI signal at the lower rate. For example, if the high speed transceiver is set by the FPGA at 1.2 Gbps and the desired signal rate to the DUT is 100 Mbps, then the bit replication must be 12 to 1. Thus a bit replication multiplier of 12 is needed. The bit replication logic block may therefore create the bit replication pattern 905, which represents "1", "0", "1" with two transitions 910 and 920, and a non-transition at 915. Frame 1 consists of a series of twelve bits (an amount equal to the bit replication multiplier) six zeroes followed by six ones. Frame 2 consists of twelve bits, all ones. Frame 3 also consists of 12 bits, six zeroes followed by six ones. The bit replication pattern 905 is passed to the high speed transceiver and the output from the high speed transceiver looks like NRZI signal 925, which can be read by the DUT.

Optionally, the bit replication logic block may look up the rate of the low speed signal as experienced by the sampling logic block and may set the high speed transceiver and the bit replication multiplier consistent with that rate.

Figure 10:
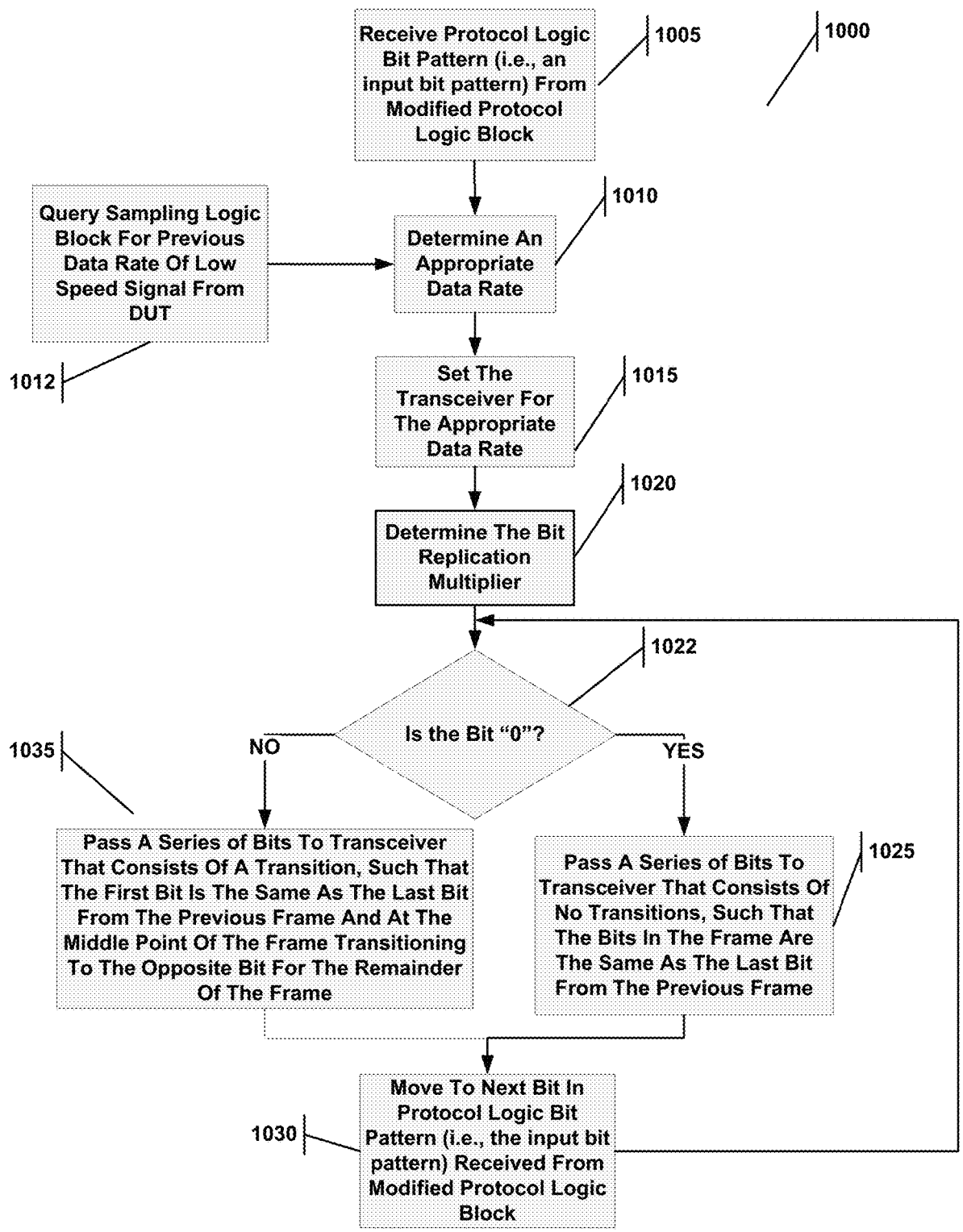
FIG. 10 illustrates a method employed by the bit replication logic block used for a NRZI signal of the novel programmable logic device for testing a device under test with both high speed and low speed signaling.

FIG. 10 illustrates the method 1000 employed by the bit replication logic block. In step 1005 a protocol logic bit pattern (i.e., an input bit pattern) is received from the modified protocol logic block. The method 1000 then determines an appropriate data rate for the low speed signal to be transmitted to the DUT. It may do this by simply selecting a speed that falls within the known rate that the DUT can detect (step 1010). Optionally, the system may query the sampling logic block regarding the previous data rate of the low speed signal from the DUT (block 1012). The high speed transceiver is then set, as well as a bit replication multiplier selected, at steps 1015 and 1020 to realize the data rate determined in step 1010. At this point, the method begins bit replication by examining the bits from the modified logic block at step 1022. If the bit is a "0" then the method must encodes a series of bits which will look like a "0" NRZI signal to the DUT. This is done by passing a bit replication pattern to the high speed transceiver that repeats the last bit from the previous frame—i.e., it consists of either all zeroes or all ones. The method then moves to the next bit in the protocol logic bit pattern (i.e., the input bit pattern) received from the modified logic block (step 1030) and performs step 1022.

If the bit is a "1" then at step 1035 the method must encode a series of bits which will look like a "1" NRZI signal to the DUT. This is done by passing a bit replication pattern to the high speed transceiver that contains a transition. The first bit repeats the last bit from the previous frame until the middle bit of the frame where it transitions to the opposite bit for the remainder of the frame. The method then moves to the next bit in the protocol logic bit pattern received from the modified logic block and performs step 1022.

It will be apparent that other low-speed signals can be decoded by the high speed transceiver according to the present invention. For example, a non-return to zero (NRZ) where the position of the NRZ low speed signal represents the bit to be encoded. When a bit is changed from the previous bit, the NRZ scheme includes a transition. Just like the PWM and NRZI methods described above, the method oversamples the low speed signal and then first determines the appropriate frame start position and size, after which the method determines what bit is encoded by the frame. In the case of PWM or NRZ, the method looks for the majority of bits in the frame (or the bit position at the middle of the frame) and assigns that frame a value of the majority position. For NRZI, the method determines if there is a transition and if so encodes for a "1" for the frame, if not a "0" for that frame.

The methods described in FIGS. 3 through 10 can be programmed into the FPGA. Once programmed the FPGA can process both the low speed signaling and high speed signaling using the same high speed transceiver without the need for intermediate analogue circuitry. If a new DUT is to be tested, and the new DUT has different signaling speeds, the FPGA can be reprogrammed so that the bit replication and sampling fall within the range of the new DUT. There would be no need to install a new analogue board, or to draw out new control lines from the FPGA to guarantee that timing is properly synchronized.

The invention has been described in connection with specific embodiments that illustrate examples of the invention but do not limit its scope. Various example systems have been shown and described having various aspects and elements. Unless indicated otherwise, any feature, aspect or element of any of these systems may be removed from, added to, combined with or modified by any other feature, aspect or element of any of the systems. As will be apparent to persons skilled in the art, modifications and adaptations to the above-described systems and methods can be made without departing from the spirit and scope of the invention, which is defined only by the following claims. Moreover, the applicant expressly does not intend that the following claims "and the embodiments in the specification to be strictly coextensive." Phillips v. AHW Corp., 415 F.3d 1303, 1323 (Fed. Cir. 2005) (en banc).

The invention claimed is:

1. A programmable logic device for testing a device under test (DUT) that outputs a low speed signal and a high speed signal, the programmable logic device comprising:
   a high speed transceiver coupled to receive the low speed signal output, wherein the low speed signal comprises a plurality of frames with each frame encoding a bit, and wherein the high speed transceiver is configured to sample the low speed signal multiple times per frame to create a high speed sample pattern; and
   a programmable logic block coupled to the high speed transceiver and adapted to decode the high speed sample pattern, wherein the programmable logic block comprises:
      a sampling block configured to:
         a. determine from the high speed sample pattern each frame of the plurality of frames; and
         b. for each frame, determine whether the high speed sample pattern encodes a zero or a one; and
      a protocol logic block and a bit replication block adapted to encode a second low speed signal, wherein the bit replication block further comprises circuitry configured to:
         a. receive an input bit pattern from the protocol logic block that comprises a plurality of bits:
         b. determine an appropriate bit replication multiplier;
         c. for each bit in the input bit pattern, create a bit replication pattern comprising a series of bits equal to the bit replication multiplier and based on a value of a respective bit in the input bit pattern; and
         d. pass the bit replication pattern to the high speed transceiver,
      wherein
         the high speed transceiver is adapted to receive a high speed signal from the DUT, wherein the programmable logic block bypasses the sampling block and passes the high speed signal to a protocol logic block.

2. The programmable logic device of claim 1 wherein the programmable logic device comprises a Field Programmable Gate Array (FPGA).

3. The programmable logic device of claim 1 wherein the low speed signal is a pulse width modulated (PWM) signal and further comprises:
   detecting at least two consecutive falling edges in the high speed sample pattern; and
   assigning either a zero bit or a one bit to each frame based on either (1) a dominant position of the high speed sample pattern framed by the two consecutive falling edges; or (2) a position of a middle bit of a respective frame.

4. The programmable logic device of claim 1 wherein the low speed signal is a non-return to zero inverted (NRZI) signal and further comprises:
   (1) detecting a plurality of transitions and selecting a frame length based on a distance between transitions; and (2) shifting a start of each frame in the plurality away from a respective transition; and
   assigning a zero bit to a frame in the plurality if there is no transition detected in the frame, or a one bit to a frame in the plurality if there is a transition detected in the frame.

5. The programmable logic device of claim 1 wherein the low speed signal is a non-return to zero (NRZ) signal and further comprises:
   (1) detecting a plurality of transitions and selecting a frame length based on a distance between transitions; and (2) starting each frame at a respective transition; and
   assigning either a zero bit or a one bit to each frame based on either (1) a dominant position of the high speed sample pattern within a respective frame; or (2) a position of a middle bit of a respective frame.

6. The programmable logic device of claim 1 wherein the second low speed data signal is a pulse width modulated (PWM) signal or a non-return to zero (NRZ) signal and for a bit in the input bit pattern that is a zero, the series of bits contains more zeroes; and for a bit in the input bit pattern that is a one, the series of bits contains more ones.

7. The programmable logic device of claim 1 wherein the second low speed data signal is a non-return to zero inverted (NRZI) signal and for a bit in the input bit pattern that is a one, the series of bits contains a transition.

8. The programmable logic device of claim 1 further comprising a communications port adapted to connect to a testing resource, wherein the communications port allows the testing resource to communicate with the DUT.

9. The programmable logic device of claim 8, wherein the communications port is connected to the protocol logic block, and the protocol logic block processes bits received from the sampling block and passes them to the testing resource.

10. The programmable logic device of claim 8, wherein the communications port is connected to the protocol logic block, and the input bit pattern is based on a signal from the testing resource.

11. The programmable logic device of claim 8, wherein the protocol logic block is adapted to receive a signal from the testing resource, wherein the programmable logic block bypasses the bit replication block and passes a high speed signal to the high speed transceiver.

12. A system for testing a device under test (DUT) that outputs a first low speed signal and a high speed signal, the system comprising:
   field programmable gate array (FPGA) comprising a high speed transceiver coupled to the first low speed signal; and a programmable logic block connected to the high speed transceiver, the programmable logic block comprising:
      a protocol logic block;
      a sampling logic block adapted to perform the following steps:
         a. receive a high speed transceiver sample pattern from the high speed transceiver based on the first low speed signal from the DUT;
         b. determine from the high speed transceiver sample pattern each frame of a plurality of frames; and
         c. for each frame, determine whether the high speed sample pattern encodes a zero or a one; and
      a bit replication logic block adapted to perform the following steps:

a. receive an input bit pattern from the protocol logic block that comprises a plurality of bits;
b. determine an appropriate bit replication multiplier:
c. for each bit in the input bit pattern, create a bit replication pattern comprising a series of bits equal to the bit replication multiplier and based on a value of a respective bit in the input bit pattern;
d. pass the bit replication pattern to the high speed transceiver; and a testing resource connected to the FPGA, wherein the testing resource is adapted to communicate with the DUT, wherein the high speed transceiver is adapted to receive a high speed signal from the DUT, wherein the programmable logic block bypasses the sampling logic block and passes the high speed signal to the protocol logic block.

13. The system of claim 12, wherein the high speed transceiver outputs the bit replication pattern to the DUT, wherein the output comprises a second low speed signal.

14. The system of claim 13, wherein the second low speed signal can be decoded by the DUT as a pulsed-width modulation (PWM) signal, a non-return to zero signal (NRZ) or a non-return to zero inverted (NRZI) signal.

15. The system of claim 12, wherein the testing resource is connected to the protocol logic block, and the protocol logic block processes bits received from the sampling logic block and passes them to the testing resource.

16. The system of claim 12, wherein the testing resource is connected to the protocol logic block, and the input bit pattern is based on a signal from the testing resource.

17. The system of claim 12, wherein the protocol logic block is adapted to receive a signal from the testing resource, wherein the programmable logic block bypasses the bit replication logic block and passes a high speed signal to the high speed transceiver.

18. A method of reading a low speed signal from a device under test (DUT) that outputs the low speed signal and a high speed signal, the low speed signal processed through a high speed transceiver, the method comprising:
programming sampling logic coupled to the high speed transceiver to:
  a. receive a high speed sample pattern from the high speed transceiver based on the low speed signal;
  b. determine from the high speed sample pattern each frame of a plurality of frames; and
  c. for each frame, determine whether the high speed sample pattern encodes a zero or a one;
programming bit replication logic also coupled to the high speed transceiver to:
  a. receive an input bit pattern that comprises a plurality of bits;
  b. determine an appropriate bit replication multiplier;
  c. for each bit in the input bit pattern, create a bit replication pattern comprising a series of bits equal to the bit replication multiplier and based on a value of a respective bit in the input bit pattern;
  d. pass the bit replication pattern to the high speed transceiver; and
wherein the high speed transceiver is configured to receive the high speed signal, wherein the high speed signal is configured to bypass the sampling logic.

19. The method of claim 18, wherein the low speed signal is a pulse width modulated (PWM) signal and further comprises:
detecting at least two consecutive falling edges in the high speed sample pattern;
assigning either a zero bit or a one bit to each frame based on either (1) a dominant position of the high speed sample pattern framed by the two consecutive falling edges; or (2) a position of a middle bit of a respective frame.

20. The method of claim 18, wherein the low speed data signal is a non-return to zero inverted (NRZI) signal and further comprises:
(1) detecting a plurality of transitions and selecting a frame length based on a distance between transitions; and (2) shifting a start of each frame in the plurality away from a respective transition;
assigning a zero bit to a frame in the plurality if there is no transition detected in the frame, or a one bit to a frame in the plurality if there is a transition detected in the frame.

21. The method of claim 18, wherein the low speed data signal is a non-return to zero (NRZ) signal and further comprises:
(1) detecting a plurality of transitions and selecting a frame length based on a distance between transitions; and (2) starting each frame at a respective transition; and
assigning either a zero bit or a one bit to each frame based on either (1) a dominant position of the high speed sample pattern within a respective frame; or (2) a position of a middle bit of a respective frame.

* * * * *